United States Patent
You et al.

(10) Patent No.: US 12,120,863 B2
(45) Date of Patent: Oct. 15, 2024

(54) SEMICONDUCTOR STRUCTURE AND MANUFACTURING METHOD THEREOF

(71) Applicants: CHANGXIN MEMORY TECHNOLOGIES, INC., Hefei (CN); BEIJING SUPERSTRING ACADEMY OF MEMORY TECHNOLOGY, BeiJing (CN)

(72) Inventors: Kang You, Hefei (CN); Jie Bai, Hefei (CN)

(73) Assignees: CHANGXIN MEMORY TECHNOLOGIES, INC., Hefei (CN); BEIJING SUPERSTRNG ACADEMY OF MEMORY TECHNOLOGY, Beijing (CN)

( * ) Notice: Subject to any disclaimer, the term of this patent is extended or adjusted under 35 U.S.C. 154(b) by 179 days.

(21) Appl. No.: 17/845,113

(22) Filed: Jun. 21, 2022

(65) Prior Publication Data
US 2023/0064849 A1    Mar. 2, 2023

Related U.S. Application Data

(63) Continuation of application No. PCT/CN2022/077712, filed on Feb. 24, 2022.

(30) Foreign Application Priority Data

Aug. 30, 2021   (CN) .......................... 202111005625.3

(51) Int. Cl.
*H01L 21/00*    (2006.01)
*H01L 49/02*    (2006.01)
*H10B 12/00*    (2023.01)

(52) U.S. Cl.
CPC ........... *H10B 12/033* (2023.02); *H01L 28/75* (2013.01); *H01L 28/90* (2013.01); *H10B 12/31* (2023.02)

(58) Field of Classification Search
CPC ....... H10B 12/033; H10B 12/31; H01L 28/75; H01L 28/90
See application file for complete search history.

(56) References Cited

U.S. PATENT DOCUMENTS

| 6,559,495 B1 | 5/2003 | Abiko |
| 8,470,668 B2 | 6/2013 | Cho |

(Continued)

FOREIGN PATENT DOCUMENTS

| CN | 102339832 A | 2/2012 |
| CN | 102623306 A | 8/2012 |
| CN | 211628705 U | 10/2020 |

*Primary Examiner* — Richard A Booth
(74) *Attorney, Agent, or Firm* — Syncoda LLC; Feng Ma

(57) ABSTRACT

A semiconductor structure includes a substrate, a storage capacitor unit, a transistor, and an electrical connection structure. The storage capacitor unit is located at an array area and includes: N insulation posts, distributed in a direction parallel to a surface of the substrate; a bottom electrode layer; a top electrode layer, directly facing the bottom electrode layer; and a capacitor dielectric layer, located between the top and bottom electrode layers. One of the bottom or top electrode layers corresponding to the N insulation posts is a continuous film layer, and the other is discrete film layers. The transistor is located at a circuit area and includes a capacitor control terminal located in the substrate of the circuit area. The electrical connection structure is electrically connected to the capacitor control terminal, and extends from the circuit area to the array area to come into contact with a corresponding discrete film layer.

17 Claims, 10 Drawing Sheets

(56) References Cited

U.S. PATENT DOCUMENTS

| | | |
|---|---|---|
| 9,412,806 B2 | 8/2016 | Wang |
| 9,865,675 B2 | 1/2018 | Wang |
| 2003/0127679 A1 | 7/2003 | Abiko |
| 2012/0019980 A1 | 1/2012 | Cho |
| 2015/0364538 A1 | 12/2015 | Wang et al. |
| 2016/0322456 A1 | 11/2016 | Wang et al. |
| 2022/0302122 A1* | 9/2022 | Sheng .................. H01L 28/75 |
| 2023/0006032 A1* | 1/2023 | Wu ...................... H01L 28/75 |
| 2023/0067299 A1* | 3/2023 | Liu .................. H10B 12/0383 |
| 2023/0369307 A1* | 11/2023 | Zhang ................ H10B 12/033 |

* cited by examiner

SEMICONDUCTOR STRUCTURE AND MANUFACTURING METHOD THEREOF

CROSS-REFERENCE TO RELATED APPLICATIONS

This application is a U.S. continuation application of International Application No. PCT/CN2022/077712, filed Feb. 24, 2022, which claims priority to Chinese Patent Application No. 202111005625.3, filed Aug. 30, 2021. International Application No. PCT/CN2022/077712 and Chinese Patent Application No. 202111005625.3 are incorporated herein by reference in their entireties.

BACKGROUND

A memory is a memory component configured to store programs and various data information. According to a use type, the memory may be divided into a read-only memory and a random access memory. The memory generally includes a storage capacitor unit and a transistor connected to the storage capacitor unit. The storage capacitor unit is configured to store charge representing storage information. The transistor is a switch for controlling charge inflow and release of the storage capacitor unit. Currently, the storage capacitor unit is usually in a cup structure or a columnar vertical stacked structure.

However, as a process node of the memory continuously reduces, a depth-to-width ratio of a capacitor hole configured to form the storage capacitor unit gradually increases, which increases a process difficulty of manufacturing the semiconductor structure including the storage capacitor unit. In addition, when the capacitor hole is formed by etching, a precision size of the capacitor hole is difficult to control. When the capacitor hole in the memory is filled with materials to form the storage capacitor unit, incompact filling easily occurs, which affects the electrical properties of the semiconductor structure.

Therefore, a novel storage capacitor unit structure is required, to reduce the process difficulty of manufacturing the semiconductor structure and improve the electrical properties of the semiconductor structure.

SUMMARY

Embodiments of the disclosure relate to the field of semiconductors, and in particular, to a semiconductor structure and a manufacturing method thereof.

An aspect of the embodiments of the disclosure provides a semiconductor structure having an array area and a circuit area. The semiconductor structure includes a substrate, at least one storage capacitor unit, a transistor, and an electrical connection structure. The at least one storage capacitor unit is located at the array area, and each storage capacitor unit includes: N insulation posts, distributed in a direction parallel to a surface of the substrate; a bottom electrode layer, covering top surfaces and side surfaces of the insulation posts; a top electrode layer, directly facing the bottom electrode layer; and a capacitor dielectric layer, located between the top electrode layer and the bottom electrode layer. One of the bottom electrode layer corresponding to the N insulation posts or the top electrode layer corresponding to the N insulation posts is a continuous film layer, and the other of the bottom electrode layer corresponding to the N insulation posts or the top electrode layer corresponding to the N insulation posts is discrete film layers, and N is a natural number greater than or equal to 2. The transistor is located at the circuit area, and includes a capacitor control terminal located in the substrate of the circuit area. The electrical connection structure is electrically connected to the capacitor control terminal, and extends from the circuit area to the array area to come into contact with a corresponding discrete film layer.

Another aspect of the embodiments of the disclosure further provides a method for manufacturing a semiconductor structure. The semiconductor structure has an array area and a circuit area. The manufacturing method includes: providing a substrate; forming at least one storage capacitor unit on the substrate, in which the at least one storage capacitor unit is located at the array area, and each storage capacitor unit includes: N insulation posts, distributed in a direction parallel to a surface of the substrate; a bottom electrode layer, covering top surfaces and side surfaces of the insulation posts; a top electrode layer, directly facing the bottom electrode layer; and a capacitor dielectric layer, located between the top electrode layer and the bottom electrode layer, in which One of the bottom electrode layer corresponding to the N insulation posts or the top electrode layer corresponding to the N insulation posts is a continuous film layer, and the other of the bottom electrode layer corresponding to the N insulation posts or the top electrode layer corresponding to the N insulation posts is discrete film layers, and N is a natural number greater than or equal to 2; forming a transistor at the circuit area, in which the transistor includes a capacitor control terminal located in the substrate of the circuit area; and forming an electrical connection structure, where the electrical connection structure is electrically connected to the capacitor control terminal, and extends from the circuit area to the array area to come into contact with the corresponding discrete film layer.

BRIEF DESCRIPTION OF THE DRAWINGS

One or more embodiments are exemplified by the figures in the drawings corresponding thereto, and these exemplary descriptions do not constitute limitations of the embodiments. Elements with same reference numerals in the drawings denote similar elements. Unless otherwise stated, the figures in the drawings do not constitute a scale limitation.

DETAILED DESCRIPTION

It is to be known from the Background that, the difficulty of a process for manufacturing a semiconductor structure needs to be reduced, and the electrical properties of the semiconductor structure needs to be improved.

Embodiments of the disclosure will be described in detail below with reference to the drawings. It is to be understood by those skilled in the art that, in each embodiment of the disclosure, many technical details are provided for readers to better understand the disclosure. However, even without these technical details and various changes and modifications based on the following embodiments, the technical solutions claimed in the disclosure can also be realized.

Figure 1:
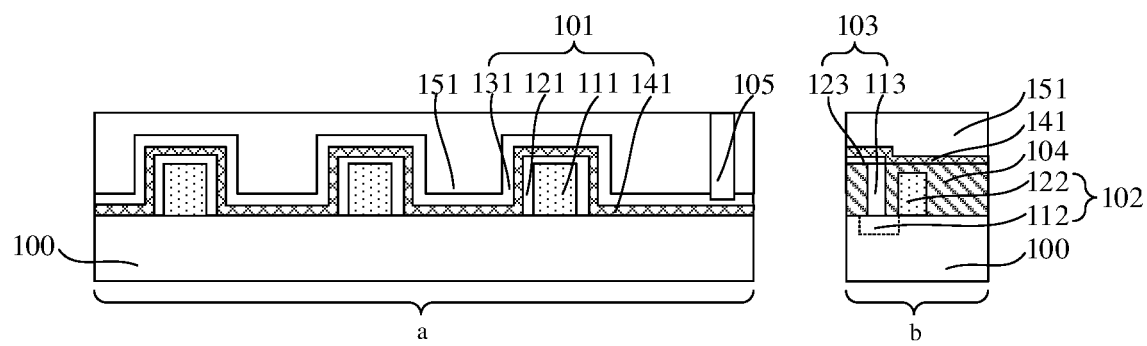
FIG. 1 to FIG. 10 are schematic diagrams of cross-sectional structures corresponding to steps of a method for manufacturing a semiconductor structure according to the embodiments of the disclosure.
Figure 2:
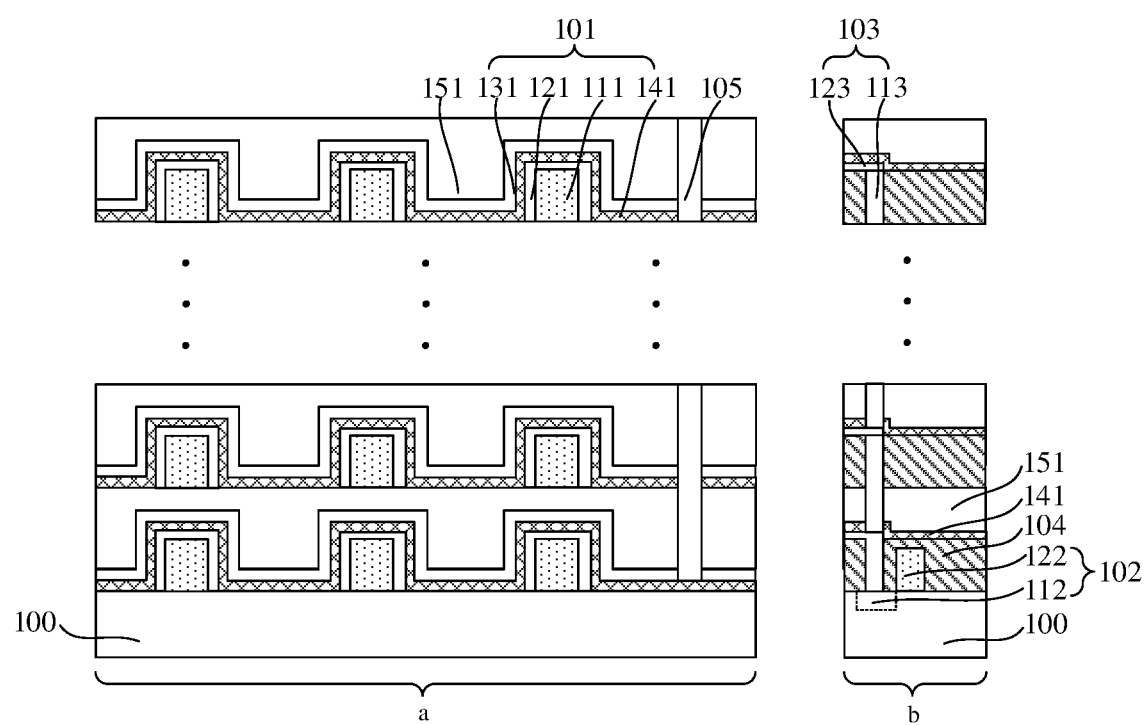

FIG. 1 and FIG. 2 are schematic diagrams of cross-sectional structures of a semiconductor structure according to an embodiment of the disclosure. It is to be noted that, in FIG. 2, the ellipsis of three points indicates that the semiconductor structure includes a plurality of layers of storage capacitor units that are repeatedly stacked, and a plurality of layers of transistors and electrical connection structures that are repeatedly stacked.

Referring to FIG. 1 or FIG. 2, the semiconductor structure has an array area a and a circuit area b, and includes: a substrate 100, at least one storage capacitor unit 101, a transistor 102, and an electrical connection structure 103. The at least one storage capacitor unit 101 is located at the array area a. Each storage capacitor unit 101 includes: N insulation posts 111, distributed in a direction parallel to a surface of the substrate 100; a bottom electrode layer 121, covering top surfaces and side surfaces of the insulation posts 111; a top electrode layer 131, directly facing the bottom electrode layer 121; and a capacitor dielectric layer 141, located between the top electrode layer 131 and the bottom electrode layer 121. One of the bottom electrode layer 121 corresponding to the N insulation posts 111 or the top electrode layer 131 corresponding to the N insulation posts 111 is a continuous film layer, and the other of the bottom electrode layer corresponding to the N insulation posts or the top electrode layer corresponding to the N insulation posts is a discrete film layer, and N is a natural number greater than or equal to 2. The transistor 102 is located at the circuit area b, and includes a capacitor control terminal 112 located in the substrate 100 of the circuit area b. The electrical connection structure 103 is electrically connected to the capacitor control terminal 112, and extends from the circuit area b to the array area a to come into contact with the corresponding discrete film layer.

In a columnar vertical stacked storage capacitor unit, an area where the bottom electrode layer and the top electrode layer directly face each other is a plane. In the embodiments of the disclosure, the bottom electrode layer 121 at least covers the top surfaces and side surfaces of the insulation posts 111. The top electrode layer 131 and the bottom electrode layer 121 directly face each other. Then, the area where the bottom electrode layer 121 and the top electrode layer 131 directly face each other includes at least areas corresponding to the top surfaces and side surfaces of the insulation posts 111. In this way, it is facilitated that a facing area between the bottom electrode layer 121 and the top electrode layer 131 is increased, so that the electric capacity of the storage capacitor unit can be increased. Therefore, it is facilitated that the electrical properties of the semiconductor structure is improved.

In a cup-shaped storage capacitor unit, a capacitor hole with a large depth-to-width ratio is required to be formed, and the bottom electrode layer and the top electrode layer are formed on the basis of the capacitor hole. In the embodiments of the disclosure, the process difficulty of forming the insulation posts 111 and forming the bottom electrode layer 121 and the top electrode layer 131 on the basis of the insulation posts 111 is reduced. The size precision of the formed bottom electrode layer 121 and the top electrode layer 131 is easier to control. Therefore, the process difficulty of manufacturing the semiconductor structure can be reduced, and the electrical properties of the semiconductor structure can be improved.

Embodiments of the disclosure will be described in more detail below with reference to the drawings.

Referring to FIG. 1 or FIG. 2, the circuit area b is located at the periphery of the array area a. The capacitor control terminal 112 in the transistor 102 is electrically connected to a discrete film layer in the storage capacitor unit 101 by the electrical connection structure 103, and is configured to control the potential of the discrete film layer.

In some embodiments, in a direction perpendicular to the surface of the substrate 100, a thickness of the insulation posts 111 may range from 1 nm to 100 nm. In the direction parallel to the surface of the substrate 100, a width of the insulation posts 111 may range from 1 nm to 100 nm. When the thickness and the width of the insulation posts 111 are within the range, the development of the semiconductor structure is facilitated towards a refinement direction. That is to say, while the large facing area between the bottom electrode layer 121 and the top electrode layer 131 is guaranteed, a space occupied by a single storage capacitor unit 101 in the semiconductor structure is guaranteed to be of an appropriate size, so that the entire size of the semiconductor structure is prevented from being too large due to the storage capacitor unit 101. For example, the thickness of the insulation posts 111 may be 50 nm, and the width of the insulation posts 111 may be 50 nm.

In some embodiments, the bottom electrode layer 121 corresponding to the N insulation posts 111 is the discrete film layers, and the top electrode layer 131 corresponding to the N insulation posts 111 is the continuous film layer.

It is to be noted that, in FIG. 1 and FIG. 2, examples are shown only with the bottom electrode layer 121 as the discrete film layers and the top electrode layer 131 as the continuous film layer. In other embodiments, the bottom electrode layer corresponding to the N insulation posts may alternatively be the continuous film layer, and the top electrode layer corresponding to the N insulation posts may alternatively be the discrete film layers. In addition, in FIG. 1 and FIG. 2, N being 3 is shown as an example. In practical application, N is a natural number greater than or equal to 1.

A material of the bottom electrode layer 121 includes at least one of TiN, Ti, W, or Mo. A material of the top electrode layer 131 includes at least one of TiN, Ti, W, or Mo. In some embodiments, the material of the bottom electrode layer 121 may be same as the material of the top electrode layer 131. Therefore, the process for manufacturing the storage capacitor unit 101 is simplified, and a manufacturing cost of the storage capacitor unit 101 is reduced. In other embodiments, the material of the bottom electrode layer may alternatively be different from the material of the top electrode layer.

In addition, a material of the capacitor dielectric layer 141 includes at least one of ZrO, AlO, HfO, or NbO, and is configured to guarantee the capacitor dielectric layer 141 to have a high dielectric constant, so as to increase the electric capacity of the storage capacitor unit 101.

Referring to FIG. 1 or FIG. 2 again, the semiconductor structure may further include a dielectric layer 104. The dielectric layer 104 is located on the substrate 100 of the circuit area b. The electrical connection structure 103 includes: a conductive post 113, penetrating the dielectric layer 104 and electrically connected to the capacitor control terminal 112; and an electrical connection layer 123, located on a top surface of the dielectric layer 104, being in contact with a top surface of the conductive post 113, and extending from the circuit area b to the array area a to come into contact with the corresponding discrete film layer.

In addition, the transistor 102 further includes a gate 122. In some embodiments, the gate 122 is located on the surface of the substrate 100, located in the dielectric layer 104, and is spaced apart from the conductive post 113.

It is to be noted that, in FIG. 1 and FIG. 2, examples are shown with an approximate range of the capacitor control terminal 112 in the substrate 100 circled only by a dashed box. In practical application, a shape of the range where the capacitor control terminal 112 is located in the substrate 100 is not limited, as long as the capacitor control terminal 112 is located on a side of the substrate 100 right under the gate 122.

In some embodiments, when the bottom electrode layer 121 is the discrete film layers, the electrical connection layer 123 is in contact with and electrically connected to the bottom electrode layer 121, and a material of the electrical connection layer 123 may be the same as the material of the bottom electrode layer 121. In other embodiments, when the top electrode layer is the discrete film layers, the electrical connection layer is in contact with and electrically connected to the top electrode layer, and the material of the electrical connection layer may be the same as the material of the top electrode layer. Alternatively, when the bottom electrode layer is the discrete film layers, the electrical connection layer is in contact with and electrically connected to the bottom electrode layer, and the material of the electrical connection layer may be different from the material of the bottom electrode layer. Alternatively, when the top electrode layer is the discrete film layers, the electrical connection layer is in contact with and electrically connected to the top electrode layer, and the material of the electrical connection layer may be different from the material of the top electrode layer.

In the above embodiments, the material of the electrical connection layer 123 is the same as the material of the discrete film layer, so that the material of the electrical connection layer 123 and the discrete film layers can be an integrally formed structure. Therefore, the process for manufacturing the semiconductor structure can be simplified, and the manufacturing cost of the semiconductor structure can be reduced. In other embodiments, the material of the electrical connection layer may alternatively be different from the material of the discrete film layers.

In some embodiments, the capacitor dielectric layer 141 corresponding to the N insulation posts 111 is a continuous film layer. The capacitor dielectric layer 141 is further located on the top surface of the dielectric layer 104 and the top surface of the electrical connection layer 123. That is to say, the capacitor dielectric layer 141 is not only located at the array area a, but also located at the circuit area b. The capacitor dielectric layer 141 located at the circuit area b is configured to achieve insulation between the electrical connection layer and other unrelated conductive structures.

For the number of the storage capacitor units 101, it will be described in detail below referring to FIG. 1 to FIG. 2.

In some embodiments, referring to FIG. 1, there is 1 storage capacitor unit 101. The semiconductor structure further includes: an insulation layer 151, located on top surfaces of the top electrode layer 131 and the capacitor dielectric layer 141; and a conductive via 105, at least penetrating the insulation layer 151, and being in contact with and electrically connected to the top electrode layer 131 that is the continuous film layer. The insulation layer 151 may be a continuous film layer, and is configured to allow the top surface of the semiconductor structure of the array area a to be flush with the top surface of the semiconductor structure of the circuit area b, and to prevent the top electrode layer 131 from being exposed. The conductive via 105 is configured to control the potential of the top electrode layer 131 that is a continuous film layer.

FIG. 1 is an example where the conductive via 105 penetrates the top electrode layer 131 of partial thickness to be in contact with and electrically connected to the top electrode layer 131. In practical application, the conductive via may penetrate the top electrode layer so as to be in contact with and electrically connected to the top electrode layer. Alternatively, the conductive via may penetrate only the insulation layer so as to be in contact with and electrically connected to the top surface of the top electrode layer.

In some other embodiments, referring to FIG. 2, the semiconductor structure includes M storage capacitor units 101 stacked in the direction perpendicular to the surface of the substrate 100, where M is a natural number greater than or equal to 2. The semiconductor structure further includes: an insulation layer 151, located between adjacent layers of storage capacitor units 101; and a conductive via 105, penetrating the insulation layer 151 and the continuous film layer of each of the storage capacitor units 101, to allow the conductive via 105 to come into contact with the continuous film layer of each of the storage capacitor units 101.

In addition, the conductive via 105 further penetrates the capacitor dielectric layers 141 in the other storage capacitor units 101 other than the storage capacitor unit 101 in contact with the substrate 100, so as to be configured to control the potential of the top electrode layer 131 being a continuous film layer.

The insulation layer 151 is configured to achieve electric insulation between the discrete film layers in adjacent layers of storage capacitor units 101. M storage capacitor units 101 are stacked in the direction perpendicular to the surface of the substrate 100, so that the overall electric capacity of the semiconductor structure is further increased.

The semiconductor structure includes M electrical connection structures 103 stacked in the direction perpendicular to the surface of the substrate 100, and the electrical connection structures 103 in adjacent layers are in contact with each other.

For the storage capacitor units 101 other than the storage capacitor unit 101 in contact with the substrate 100, the conductive post 113 in each of the storage capacitor units 101 not only penetrates the dielectric layer 104 in the storage capacitor unit 101, but also penetrates the insulation layer 151 and the capacitor dielectric layer 141 under the storage capacitor unit 101, so that a bottom surface of the conductive post 113 in the storage capacitor unit 101 is in contact with and electrically connected to the top surface of the electrical connection layer in a storage capacitor unit 101 under the storage capacitor unit 101. In this way, the corresponding discrete film layers in the plurality of layers of storage capacitor units 101 are controlled by a same transistor 102 by means of the electrical connection structures 103 that are in contact with and electrically connected in order.

It is to be noted that FIG. 2 is an example where orthographic projections of the insulation posts 111 in adjacent layers of storage capacitor units 101 on the substrate 100 coincide with each other. In practical application, the orthographic projections of the insulation posts in adjacent layers of storage capacitor units on the substrate may partially overlap or not coincide with each other at all. That is to say, an arrangement mode of the insulation posts in the storage capacitor units is not limited by an arrangement mode of the insulation post in a storage capacitor unit adjacent to the storage capacitor unit, as long as the conductive via is not in contact with the discrete film layer in each storage capacitor unit when being in contact with and electrically connected to the continuous film layer in each storage capacitor unit.

In addition, FIG. 2 only shows three layers of storage capacitor units 101 in the semiconductor structure. FIG. 2 is an example where the conductive via 105 penetrates the top electrode layer 131 being the continuous film layer in the storage capacitor unit 101 in contact with the substrate 100. In practical application, the conductive via may penetrate the top electrode layer of partial thickness in the storage capacitor unit in contact with the substrate, so as to be in contact with and electrically connected to the top electrode layer. Alternatively, the conductive via may only penetrate the insulation layer in the storage capacitor unit in contact with the substrate, so as to be in contact with and electrically connected to the top surface of the top electrode layer in the storage capacitor unit in contact with the substrate.

In the above two embodiments, in FIG. 1 and FIG. 2, examples are shown with the continuous film layer as the top electrode layer 131 and the discrete film layers as the bottom electrode layer 121. Then, the conductive via 105 penetrates the top electrode layer 131, to allow the conductive via 105 to be in contact with the top electrode layer 131 of each storage capacitor unit 101. The transistor 102 controls the potential of the bottom electrode layer 121 by the capacitor control terminal 112 and the electrical connection structure 103. The conductive via 105 is configured to control the potential of the top electrode layer 131. In practical application, the continuous film layer may be the bottom electrode layer, and the discrete film layer may be the top electrode layer. Then, the conductive via penetrates the bottom electrode layer, to allow the conductive via to be in contact with the bottom electrode layer of each storage capacitor unit. The transistor is configured to control the potential of the top electrode layer. The conductive via is configured to control the potential of the bottom electrode layer.

In the above two embodiments, the number of the transistors 102 may equal the number of the insulation posts 111 in a single storage capacitor unit 101. That is to say, the number of the transistors 102 is N, and the transistors 102 are in one-to-one correspondence with the insulation posts 111 in the single storage capacitor unit 101. The number of the electrical connection structures 103 is m times of N, where m is a natural number greater than or equal to 1.

It is to be noted that, the number of the insulation posts 111 equals to the number of the discrete film layers, that is, the insulation posts 111 are in one-to-one correspondence with the discrete film layers. The plurality of electrical connection structures 103 in a same transistor 102 respectively correspond to at least one discrete film layer in each storage capacitor unit 101.

In some embodiments, the conductive posts 113 are in one-to-one correspondence with the electrical connection structures 103. The discrete film layers among the plurality of layers of storage capacitor units 101 are also in one-to-one correspondence with each other. In addition, the corresponding discrete film layers are in contact with and electrically connected to the plurality of electrical connection structures 103 in a same transistor 102 one to one. The number of the transistors equals to the number of the discrete film layers in a single layer of the storage capacitor unit 101. In some other embodiments, a same conductive post 113 may be in contact with and electrically connected to at least two electrical connection layers 123. That is to say, a same transistor 102 may control at least two discrete film layers in a same storage capacitor unit. Therefore, in practical application, a specific connection relationship between the electrical connection structure and the discrete film layer in the storage capacitor unit is not limited, and may be reasonably designed according to circuit connection requirements.

In addition, the semiconductor structure further includes: a word line (not shown), located in the substrate 100 of the array area a, where a first doped area (not shown) and a second doped area (not shown) are provided in the substrate 100 at two opposite sides of the word line respectively, in which the first doped area is electrically connected to the bottom electrode layer 121; and a bit line (not shown), located at the array area a, and electrically connected to the second doped area.

To sum up, the top electrode layer 131 and the bottom electrode layer 121 in the storage capacitor unit 101 are in a wavy shape or a peak shape integrally. In an aspect, the facing area between the top electrode layer 131 and the bottom electrode layer 121 is increased, so that the electric capacity of the storage capacitor unit 101 is increased. The overall electric capacity of the semiconductor structure may be further increased by stacking the plurality of layers of storage capacitor units 101. Therefore, the electrical properties of the semiconductor structure can be improved. In another aspect, from the perspective of a manufacturing process, through the formation of the storage capacitor unit having such a shape, the accuracy of the overall size of the formed storage capacitor units 101 is enhanced while the process difficulty of manufacturing the storage capacitor units is reduced.

The embodiments of the disclosure further provide a method for manufacturing a semiconductor structure, for forming the above semiconductor structure. The method for manufacturing a semiconductor structure provided in the embodiments of the disclosure will be described in detail below with reference to the drawings. The parts that are the same as or correspond to the above embodiments are not described herein again.

Figure 3:
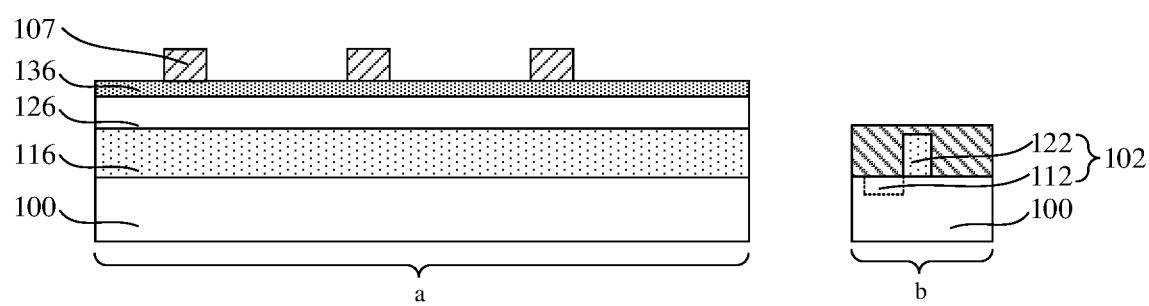
Figure 4:
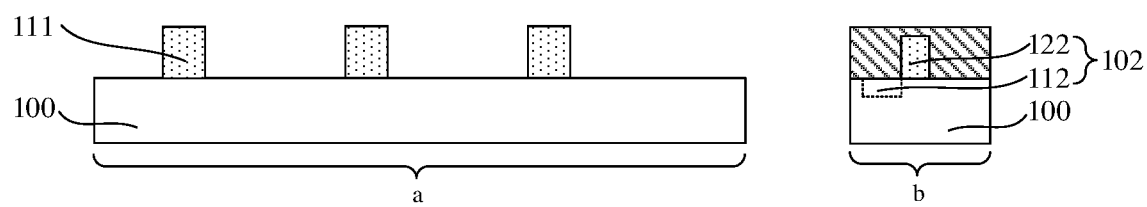

Referring to FIG. 3, a substrate 100 is provided. The substrate 100 has an array area a and a circuit area b. The circuit area b is located around the array area a.

Referring to FIG. 3 to FIG. 10, at least one storage capacitor unit 101 is formed on the substrate 100. The at least one storage capacitor unit 101 is located at the array area a. Each storage capacitor unit 101 includes: N insulation posts 111, distributed in a direction parallel to a surface of the substrate 100; a bottom electrode layer 121, covering top surfaces and side surfaces of the insulation posts 111; a top electrode layer 131, directly facing the bottom electrode layer 121; and a capacitor dielectric layer 141, located between the top electrode layer 131 and the bottom electrode layer 121. One of the bottom electrode layer 121 corresponding to the N insulation posts 111 or the top electrode layer 131 corresponding to the N insulation posts 111 is a continuous film layer, and the other of the bottom electrode layer corresponding to the N insulation posts or the top electrode layer corresponding to the N insulation posts is discrete film layers, and N is a natural number greater than or equal to 2. A transistor 102 is formed at the circuit area b. The transistor includes a capacitor control terminal 112 located in the substrate 100 of the circuit area b. An electrical connection structure 103 is formed. The electrical connection structure 103 is electrically connected to the capacitor control terminal 112, and extends from the circuit area b to the array area a to come into contact with the corresponding discrete film layer.

In some embodiments, the formation of the insulation posts 111 includes the following process steps.

Referring to FIG. 3 to FIG. 4 again, in a direction perpendicular to the surface of the substrate 100, a first dielectric layer 116, a second dielectric layer 126, a third dielectric layer 136, and a mask 107 having openings are formed on the substrate 100.

The first dielectric layer 116, the second dielectric layer 126, and the third dielectric layer 136 are successively etched with the mask 107 as a mask film, and the mask 107 and the remained first dielectric layer 116 and the second dielectric layer 126 are removed, leaving the remained third dielectric layer 136 as the insulation posts 111. In some examples, the mask 107 may be made of a photoresist. The first dielectric layer 116 may be a silicon nitride layer. The second dielectric layer 126 may be a spin-coated hard mask layer. The third dielectric layer 136 may be a silicon oxynitride layer. Therefore, the first dielectric layer 116, the second dielectric layer 126 and the third dielectric layer 136 are etched with the mask 107 as a mask film, and an opening pattern in the mask 107 is passed down in sequence, so that the size accuracy of the finally formed insulation posts 111 can be enhanced.

In some embodiments, in a direction perpendicular to the surface of the substrate 100, a thickness of the insulation posts 111 may range from 1 nm to 100 nm. In the direction parallel to the surface of the substrate 100, a width of the insulation posts 111 may range from 1 nm to 100 nm. In practical application, according to circuit connection requirements, the thickness and width of the insulation posts 111 may be reasonably set, so as to adjust a facing area between the bottom electrode layer 121 and the top electrode layer 131.

Compared with the formation of the capacitor hole with a large depth-to-width ratio, in the embodiments of the disclosure, the process step of forming the insulation posts 111 is simple, and easily and accurately controls the size accuracy of the finally formed insulation posts 111. When the bottom electrode layer and the top electrode layer are subsequently formed on the basis of the insulation posts 111, the quality and size accuracy of the formed bottom electrode layer and the top electrode layer are easier to control. Therefore, the process difficulty of manufacturing the semiconductor structure can be reduced, and the electrical properties of the semiconductor structure can be improved.

In some embodiments, before the insulation posts 111 is formed, the capacitor control terminal 112 and a gate 122 on the surface of the substrate 100 are formed in the substrate 100 of the circuit area b, so that the transistor 102 is formed in the circuit area b, and a dielectric layer 104 covering the transistor 102 is formed. In other embodiments, the transistor at the circuit area may alternatively be formed after the insulation posts are formed and before the bottom electrode layer is formed.

Figure 5:
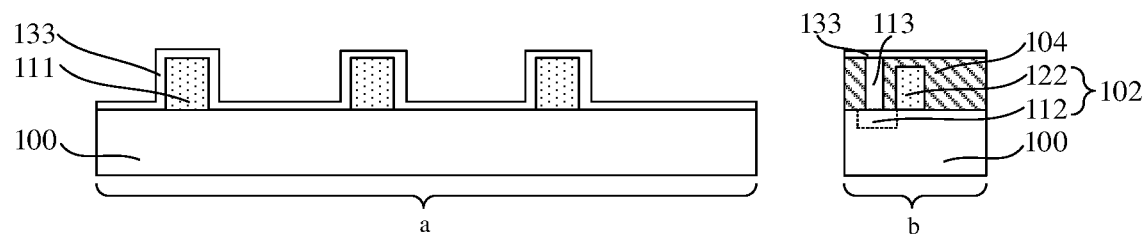
Figure 6:
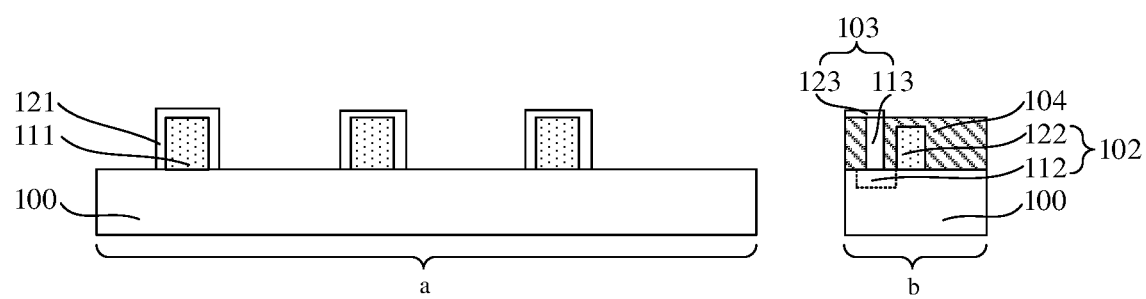

Referring to FIG. 5 to FIG. 6, the formation of the bottom electrode layer 121 and the electrical connection structure 103 may include the following process steps.

Referring to FIG. 5, a conductive post 113 is formed. The conductive post 113 penetrates the dielectric layer 104 and is electrically connected to the capacitor control terminal 112.

Referring to FIG. 5 again, a continuous first conductive layer 133 is formed. The first conductive layer 133 is located on top surfaces and side surfaces of the insulation posts 111, is further located on a top surface of the dielectric layer 104 of the circuit area b, and is in contact with a top surface of the conductive post 113.

Since a depth-to-width ratio of a spacing between adjacent insulation posts 111 is smaller compared with the capacitor hole with a large depth-to-width ratio, so that the continuity of the first conductive layer 133 is guaranteed, and the continuity of the capacitor dielectric layer and the second conductive layer that are subsequently formed are also guaranteed. Therefore, the quality of the formed top electrode layer and the bottom electrode layer can be enhanced.

Referring to FIG. 5 to FIG. 6, the first conductive layer 133 is patterned to form an electrical connection layer 123 and a plurality of mutually discrete bottom electrode layers 121. The electrical connection layer 123 is located on the top surface of the dielectric layer 104, is in contact with the top surface of the conductive post 113, and extends from the circuit area b to the array area a to be electrically connected to the corresponding bottom electrode layer 121. The electrical connection structure 103 is commonly formed by the electrical connection layer 123 and the conductive post 113.

In other embodiments, the first conductive layer of the circuit area may only be patterned to form the electrical connection layer. The continuous first conductive layer at the array area is used as the bottom electrode layer.

Figure 7:
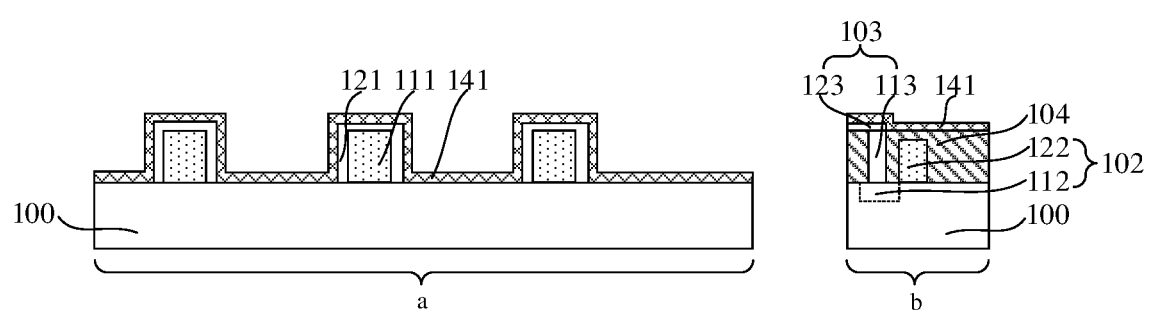
Figure 8:
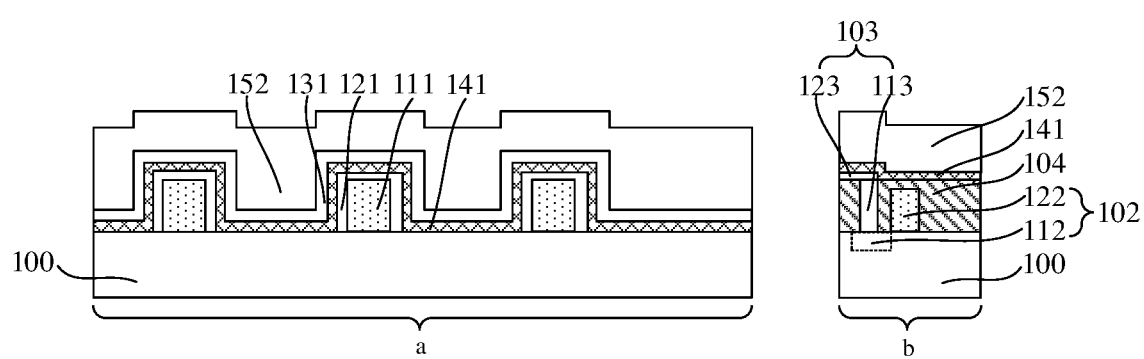

Referring to FIG. 7 to FIG. 8, the formation of the capacitor dielectric layer 141 and the top electrode layer 131 may include the following process steps.

Referring to FIG. 7, the capacitor dielectric layer 141, which is continuous, is formed on the surfaces of the bottom electrode layers 121. The capacitor dielectric layer 141 is located between adjacent insulation posts 111, and further located on the top surface of the electrical connection layer 123 and the top surface of the dielectric layer 104. The second conductive layer (not shown) is formed on the top surface of the capacitor dielectric layer 141.

Referring to FIG. 8, the second conductive layer of the circuit area b is removed, and the remained second conductive layer is used as the top electrode layer 131.

Referring to FIG. 8 again, an initial insulation layer 152 is formed on the top surfaces of the top electrode layer 131 and the capacitor dielectric layer 141 of the circuit area b. The spacing between adjacent insulation posts 111 is filled up with the initial insulation layer 152.

Referring to FIG. 8 and FIG. 1, the initial insulation layer 152 is planarized to form the insulation layer 151, so that the top surface of the insulation layer 151 of the array area a is flush with the top surface of the insulation layer 151 of the circuit area b.

In some embodiments, referring to FIG. 1, a layer of storage capacitor unit 101 is formed according to an actual circuit requirement.

Figure 9:
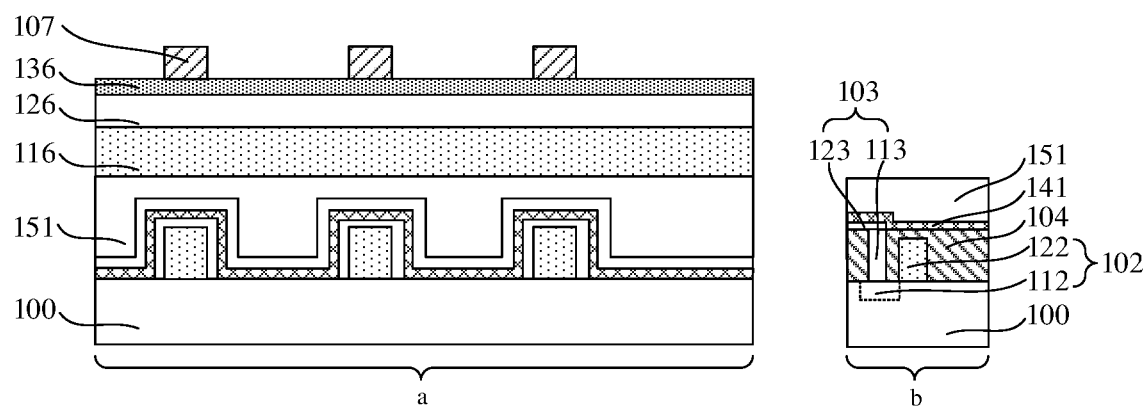
Figure 10:
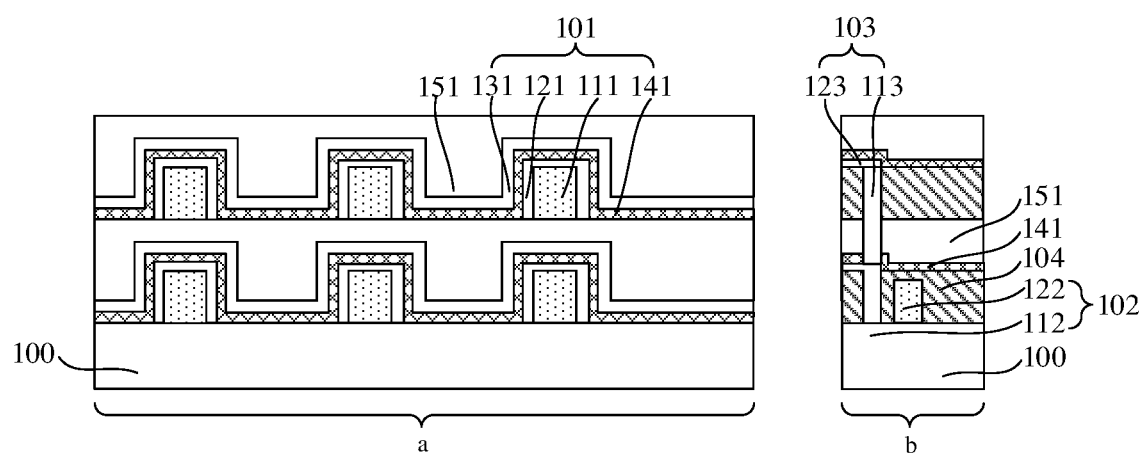

In some other embodiments, on the basis of FIG. 1, referring to FIG. 9, FIG. 10, and FIG. 2, the manufacturing method may further include: forming M storage capacitor units 101 stacked in the direction perpendicular to the surface of the substrate 100, where M is a natural number greater than or equal to 2, and there is an insulation layer 151 between adjacent layers of storage capacitor units 101; and forming a conductive via 105, where the conductive via 105 penetrates the insulation layer 151 and the continuous film layer of each of the storage capacitor units 101, to allow the conductive via 105 to come into contact with the continuous film layer of each of the storage capacitor units 101.

FIG. 1 is an example where the top electrode layer 131 is the continuous film layer. That is to say, the formed conductive via 105 is in contact with and electrically connected to the top electrode layer 131 of each storage capacitor unit 101. In practical application, as an example, the bottom electrode layer may alternatively be the continuous film layer. That is to say, the formed conductive via is in contact with and electrically connected to the bottom electrode layer of each storage capacitor unit.

Referring to FIG. 1 and FIG. 9, a first dielectric layer 116, a second dielectric layer 126, a third dielectric layer 136, and a mask 107 having openings that are successively stacked are formed again on the basis of the formed insulation layer 151, to form the insulation posts 111 in the second storage capacitor unit 101. A specific method for forming the insulation posts is the same as the above embodiments, which is not described herein again.

Referring to FIG. 10, on the basis of forming the insulation posts 111, the bottom electrode layers 121, the top electrode layer 131, the capacitor dielectric layer 141, the insulation layer 151, and the electrical connection structures 103 corresponding to the bottom electrode layers 121 are formed. Steps of forming the bottom electrode layers 121, the top electrode layer 131, the capacitor dielectric layer 141, the insulation layer 151, and the electrical connection structures 103 are the same as the above embodiments, which are not described herein again.

Referring to FIG. 10 and FIG. 2, and so on, according to a circuit requirement in an actual circuit, the steps of forming the insulation posts 111, the bottom electrode layers 121, the top electrode layer 131, the capacitor dielectric layer 141, the insulation layer 151, and the electrical connection structures 103 may be repeated, to form M storage capacitor units 101 stacked in the direction perpendicular to the surface of the substrate 100.

To sum up, in an aspect, compared with the formation of the capacitor hole with a large depth-to-width ratio, in the embodiments of the disclosure, the process step of forming the insulation posts 111 is simple, and easily and accurately controls the size accuracy of the finally formed insulation posts 111. When the bottom electrode layers 121 and the top electrode layer 131 are formed on the basis of the insulation posts 111, the quality and size accuracy of the formed top electrode layer 131 and the bottom electrode layers 121 are easier to control. Therefore, the process difficulty of manufacturing the semiconductor structure can be reduced, and the electrical properties of the semiconductor structure can be improved. In another aspect, the formed top electrode layer 131 and the bottom electrode layers 121 are in a wavy shape or a peak shape integrally, which is conductive to increasing the facing area between the top electrode layer 131 and the bottom electrode layers 121, so that the electric capacity of the storage capacitor unit can be increased. Therefore, the electrical properties of the semiconductor structure can be improved.

Those of ordinary skill in the art can understand that the above implementation modes are specific embodiments for realizing the disclosure, and in practical application, various changes may be made in form and details without departing from the spirit and the scope of the disclosure. Any person skilled in the art may make respective changes and modifications without departing from the spirit and scope of the disclosure. Therefore, the protection scope of the disclosure should be subject to the scope defined by the claims.

INDUSTRIAL APPLICABILITY

Embodiments of the disclosure provide a semiconductor structure and a method for manufacturing the same. The semiconductor structure includes a substrate, a storage capacitor unit, a transistor, and electrical connection structures. The storage capacitor unit is located at an array area and includes: N insulation posts, distributed in a direction parallel to a surface of the substrate; a bottom electrode layer, covering top surfaces and side surfaces of the insulation posts; a top electrode layer, directly facing the bottom electrode layer; and a capacitor dielectric layer, located between the top electrode layer and the bottom electrode layers. One of the bottom electrode layer corresponding to the N insulation posts or the top electrode layer corresponding to the N insulation posts is a continuous film layer, and the other of the bottom electrode layer corresponding to the N insulation posts or the top electrode layer corresponding to the N insulation posts is discrete film layers, and N is a natural number greater than or equal to 2. The transistor is located at a circuit area and includes a capacitor control terminal located in the substrate of the circuit area. The electrical connection structure is electrically connected to the capacitor control terminal, and extends from the circuit area to the array area to come into contact with a corresponding discrete film layer.

In the above technical solutions, the bottom electrode layers at least covers the top surfaces and side surfaces of the insulation posts. One of the bottom electrode layer corresponding to the N insulation posts or the top electrode layer corresponding to the N insulation posts is the continuous film layer, and the other of the bottom electrode layer corresponding to the N insulation posts or the top electrode layer corresponding to the N insulation posts is discrete film layers. In this way, the top electrode layer and the bottom electrode layer in the storage capacitor unit are in a wavy shape or a peak shape integrally. In an aspect, from the perspective of a manufacturing process, the formation of the storage capacitor unit having such a shape avoids manufacturing the capacitor hole configured to form the storage capacitor unit, so that the process difficulty of manufacturing the storage capacitor unit can be reduced, so as to reduce the process difficulty of manufacturing the semiconductor structure. In another aspect, since the depth-to-width ratio of the capacitor hole increases with the reducing of the process node of the memory, the formed storage capacitor unit is poor in quality, resulting in an adverse impact on the electrical properties of the semiconductor structure. By using the storage capacitor unit in the disclosure, the capacitor hole is not required to be manufactured, so that the formed storage capacitor unit is guaranteed to have a high quality. In addition, since the top electrode layer and the bottom electrode layer are in a wavy shape or a peak shape integrally, a facing area between the top electrode layer and the bottom electrode layer is increased, so that the electric capacity of the storage capacitor unit can be increased. Therefore, the electrical properties of the semiconductor structure can be improved.

The invention claimed is:

1. A semiconductor structure, having an array area and a circuit area, and comprising:
    a substrate;
    at least one storage capacitor unit, located at the array area, wherein each storage capacitor unit comprises: N insulation posts, distributed in a direction parallel to a surface of the substrate; a bottom electrode layer, covering top surfaces and side surfaces of the insulation posts; a top electrode layer, directly facing the bottom electrode layer; and a capacitor dielectric layer, located between the top electrode layer and the bottom electrode layer, wherein one of the bottom electrode layer corresponding to the N insulation posts or the top electrode layer corresponding to the N insulation posts is a continuous film layer, and another of the bottom electrode layer corresponding to the N insulation posts or the top electrode layer corresponding to the N insulation posts is discrete film layers, and N is a natural number greater than or equal to 2;
    a transistor, located at the circuit area, and comprising a capacitor control terminal located in the substrate of the circuit area; and
    an electrical connection structure, electrically connected to the capacitor control terminal, and extending from the circuit area to the array area to come into contact with a corresponding discrete film layer.

2. The semiconductor structure of claim 1, further comprising a dielectric layer, located on the substrate of the circuit area; wherein the electrical connection structure comprises:
    a conductive post, penetrating the dielectric layer and electrically connected to the capacitor control terminal; and
    an electrical connection layer, located on a top surface of the dielectric layer, being in contact with a top surface of the conductive post, and extending from the circuit area to the array area to come into contact with the corresponding discrete film layer.

3. The semiconductor structure of claim 2, wherein a material of the electrical connection layer is same as a material of the discrete film layers.

4. The semiconductor structure of claim 2, wherein the capacitor dielectric layer corresponding to the N insulation posts is a continuous film layer, and is further located on the top surface of the dielectric layer and a top surface of the electrical connection layer.

5. The semiconductor structure of claim 1, wherein a number of the transistor is N, and a number of the electrical connection structure is m times of N, wherein m is a natural number greater than or equal to 1.

6. The semiconductor structure of claim 1, wherein a material of the bottom electrode layer comprises at least one of TiN, Ti, W, or Mo; and a material of the top electrode layer comprises at least one of TiN, Ti, W, or Mo.

7. The semiconductor structure of claim 1, wherein a material of the capacitor dielectric layer comprises at least one of ZrO, AlO, HfO, or NbO.

8. The semiconductor structure of claim 1, wherein in a direction perpendicular to the surface of the substrate, a thickness of the insulation posts ranges from 1 nm to 100 nm.

9. The semiconductor structure of claim 1, wherein in the direction parallel to the surface of the substrate, a width of the insulation posts ranges from 1 nm to 100 nm.

10. The semiconductor structure of claim 1, wherein the bottom electrode layer corresponding to the N insulation posts is the discrete film layers, and the top electrode layer corresponding to the N insulation posts is the continuous film layer.

11. The semiconductor structure of claim 1, comprising M storage capacitor units stacked in a direction perpendicular to the surface of the substrate, where M is a natural number greater than or equal to 2, wherein the semiconductor structure further comprises:
    an insulation layer, located between adjacent layers of storage capacitor units; and
    a conductive via, penetrating the insulation layer and the continuous film layer of each of the storage capacitor units, to allow the conductive via to come into contact with the continuous film layer of each of the storage capacitor units.

12. The semiconductor structure of claim 11, comprising M electrical connection structures stacked in the direction perpendicular to the surface of the substrate, wherein the electrical connection structures in adjacent layers are in contact with each other.

13. The semiconductor structure of claim 1, further comprising:
    a word line, located in the substrate of the array area, wherein a first doped area and a second doped area are provided in the substrate at two opposite sides of the word line respectively, wherein the first doped area is electrically connected to the bottom electrode layer; and
    a bit line, located at the array area, and electrically connected to the second doped area.

14. A manufacturing method of a semiconductor structure, the semiconductor structure having an array area and a circuit area, wherein the method comprises:
    providing a substrate;
    forming at least one storage capacitor unit on the substrate, wherein the at least one storage capacitor unit is located at the array area, and each storage capacitor unit comprises: N insulation posts, distributed in a direction parallel to a surface of the substrate; a bottom electrode layer, covering top surfaces and side surfaces of the insulation posts; a top electrode layer, directly facing the bottom electrode layer; and a capacitor dielectric layer, located between the top electrode layer and the bottom electrode layer, wherein one of the bottom electrode layer corresponding to the N insulation posts or the top electrode layer corresponding to the N insulation posts is a continuous film layer, and another of the bottom electrode layer corresponding to the N insulation posts or the top electrode layer corresponding to the N insulation posts is discrete film layers, and N is a natural number greater than or equal to 2;
    forming a transistor at the circuit area, wherein the transistor comprises a capacitor control terminal located in the substrate of the circuit area; and
    forming an electrical connection structure, wherein the electrical connection structure is electrically connected to the capacitor control terminal, and extends from the circuit area to the array area to come into contact with a corresponding discrete film layer.

15. The manufacturing method of claim 14, wherein a dielectric layer is provided on the substrate of the circuit area; and forming the bottom electrode layer and the electrical connection structure comprises:
    forming a conductive post, wherein the conductive post penetrates the dielectric layer and is electrically connected to the capacitor control terminal;
    forming a continuous first conductive layer, wherein the first conductive layer is located on top surfaces and side surfaces of the insulation posts, is further located on a top surface of the dielectric layer of the circuit area, and is in contact with a top surface of the conductive post; and
    patterning the first conductive layer to form an electrical connection layer and a plurality of mutually discrete bottom electrode layers, wherein the electrical connection layer is located on the top surface of the dielectric layer, is in contact with the top surface of the conductive post, and extends from the circuit area to the array area to be electrically connected to the corresponding bottom electrode layer.

16. The manufacturing method of claim 15, wherein forming the capacitor dielectric layer and the top electrode layer comprises:
    forming the capacitor dielectric layer, which is continuous, on surfaces of the bottom electrode layers, wherein the capacitor dielectric layer is located between adjacent insulation posts, and is further located on a top surface of the electrical connection layer and the top surface of the dielectric layer;
    forming a second conductive layer on a top surface of the capacitor dielectric layer; and removing the second conductive layer located at the circuit area, remaining second conductive layer serving as the top electrode layer.

17. The manufacturing method of claim 16, further comprising forming M storage capacitor units stacked in a direction perpendicular to the surface of the substrate, wherein M is a natural number greater than or equal to 2, and there is an insulation layer between adjacent layers of storage capacitor units; and forming a conductive via, wherein the conductive via penetrates the insulation layer and the continuous film layer of each of the storage capacitor units, to allow the conductive via to come into contact with the continuous film layer of each of the storage capacitor units.

\* \* \* \* \*